US010097104B2

(12) United States Patent
Sasada et al.

(10) Patent No.: US 10,097,104 B2
(45) Date of Patent: Oct. 9, 2018

(54) HIGH VOLTAGE GENERATION CIRCUIT (71) Applicant: SMC Corporation, Chiyoda-ku (JP)

(72) Inventors: Naoto Sasada, Taito-ku (JP);
Tomokazu Hariya, Noda (JP);
Takayuki Toshida, Moriya (JP)

(73) Assignee: SMC CORPORATION, Chiyoda-ku (JP)

( * ) Notice: Subject to any disclaimer, the term of this patent is extended or adjusted under 35 U.S.C. 154(b) by 0 days.

(21) Appl. No.: 15/432,234

(22) Filed: Feb. 14, 2017

(65) Prior Publication Data

US 2017/0257036 A1    Sep. 7, 2017

(30) Foreign Application Priority Data

Mar. 1, 2016  (JP) ................. 2016-038642

(51) Int. Cl.
| | | |
|---|---|---|
| *H02M 7/06* | (2006.01) | |
| *H01J 37/08* | (2006.01) | |
| *H01J 37/248* | (2006.01) | |
| *H02M 1/088* | (2006.01) | |
| *H02M 7/10* | (2006.01) | |
| *H02M 1/00* | (2006.01) | |

(52) U.S. Cl.
CPC ............ *H02M 7/06* (2013.01); *H01J 37/08* (2013.01); *H01J 37/248* (2013.01); *H02M 1/088* (2013.01); *H02M 7/103* (2013.01); *H02M 2001/0048* (2013.01)

(58) Field of Classification Search
CPC .......... H02M 7/06; H02M 1/088; H02M 2001/0048; H01J 37/08; H01J 37/248
USPC ................... 250/423 R, 396 R, 397
See application file for complete search history.

(56) References Cited

U.S. PATENT DOCUMENTS

2008/0191145 A1*  8/2008  Lee ............... A61L 9/22
                                                250/423 R

FOREIGN PATENT DOCUMENTS

| JP | 7-27097 U | 5/1995 |
|---|---|---|
| JP | 9-172787 | 6/1997 |
| JP | 2000-58290 | 2/2000 |
| JP | 2008-226647 A | 9/2008 |
| JP | 2012-155857 A | 8/2012 |
| TW | 201247032 A1 | 11/2012 |

OTHER PUBLICATIONS

Korean Office Action dated Nov. 20, 2017 in Patent Application No. 10-2017-0026294 (with English translation), citing documents AO-AQ therein, 8 pages.
Combined Taiwanese Office Action and Search Report dated Nov. 10, 2017 in Patent Application No. 106105914 (with English translation).

* cited by examiner

*Primary Examiner* — Nicole Ippolito
*Assistant Examiner* — Hanway Chang
(74) *Attorney, Agent, or Firm* — Oblon, McClelland, Maier & Neustadt, L.L.P.

(57) ABSTRACT

A high voltage generation circuit is equipped with an AC power source, a positive polarity high voltage generating circuit, and a negative polarity high voltage generating circuit. A phase converter that converts the phase of an AC voltage supplied from the AC power source is disposed between the AC power source and the positive polarity high voltage generating circuit, or between the AC power source and the negative polarity high voltage generating circuit.

6 Claims, 7 Drawing Sheets

HIGH VOLTAGE GENERATION CIRCUIT

CROSS-REFERENCE TO RELATED APPLICATION

This application is based upon and claims the benefit of priority from Japanese Patent Application No. 2016-038642 filed on Mar. 1, 2016, the contents of which are incorporated herein by reference.

BACKGROUND OF THE INVENTION

Field of the Invention

The present invention relates to a high voltage generation circuit, and in particular, relates to a high voltage generation circuit which is used in an ionizer.

Description of the Related Art

Conventionally, a high voltage power source for applying positive and negative pulsed high voltage to a load has been known (refer to Japanese Laid-Open Patent Publication No. 09-172787). The high voltage power source is equipped with a plurality of switching elements, wherein a voltage value and a frequency are made variable so as to eliminate unevenness of static elimination in the case that the high voltage power source is used in a static eliminator.

Further, a static eliminating device is known in which the frequency of a voltage applied to an electrode means and the magnitudes of positive polarity and negative polarity voltages are individually controlled (refer to Japanese Laid-Open Patent Publication No. 2000-058290). Such a static eliminating device includes a first switch that opens and closes a first power supply path formed when a positive polarity high voltage is applied to the electrode means, and a second switch that opens and closes a second power supply path formed when a negative polarity high voltage is applied to the electrode means.

SUMMARY OF THE INVENTION

The devices disclosed in the publications cited above require switching of the positive and negative polarities by a plurality of switching elements, and generation of switching noise cannot be avoided. Further, there is room for improvement concerning the size or the amount of consumed electric current.

The present invention has been devised in consideration of these problems, and has the object of realizing a high voltage generation circuit, which generates positive polarity and negative polarity high voltages by means of a simple configuration, and without requiring the use of switching elements for switching of polarity. Further, another object of the present invention is to provide a high voltage generation circuit that consumes as little electric current as possible.

A high voltage generation circuit according to the present invention is a high voltage generation circuit for alternately applying a positive pulse high voltage and a negative pulse high voltage to a load, which is characterized by an AC power source, a positive polarity high voltage generating circuit, and a negative polarity high voltage generating circuit. In addition, a phase converter configured to convert the phase of an AC voltage supplied from the AC power source is disposed between the AC power source and the positive polarity high voltage generating circuit, or between the AC power source and the negative polarity high voltage generating circuit.

According to the high voltage generation circuit described above, the use of switching elements for switching of polarity is rendered unnecessary, and a high voltage generation circuit can be realized, which enables generation of positive polarity and negative polarity high voltages by means of a simple configuration. Further, the consumption current can be reduced insofar as possible.

In the above-described high voltage generation circuit, the phase converter preferably operates to invert the phase of the AC voltage supplied from the AC power source. In accordance with this feature, the positive pulse high voltage and the negative pulse high voltage can be efficiently and alternately applied in succession.

In the above-described high voltage generation circuit, each of the positive polarity high voltage generating circuit and the negative polarity high voltage generating circuit preferably includes a transformer and a voltage doubler rectifier circuit. In accordance with this feature, the positive polarity high voltage generating circuit and the negative polarity high voltage generating circuit can be made simple in structure.

In this case, transformer driving circuits configured to adjust voltage level preferably are disposed respectively between the AC power source and the positive polarity high voltage generating circuit, and between the AC power source and the negative polarity high voltage generating circuit. In accordance with this feature, the output voltage of the positive polarity high voltage generating circuit and the output voltage of the negative polarity high voltage generating circuit can be individually controlled.

Furthermore, two impedance elements preferably are connected in series between an output terminal of the positive polarity high voltage generating circuit and an output terminal of the negative polarity high voltage generating circuit, and the load preferably is connected to interconnected ends of the impedance elements. In accordance with this feature, it is possible to easily restrict the current value that flows in the load.

Further still, the load preferably is a discharge electrode of an ionizer. In accordance with this feature, with a simple circuit configuration, positive polarity ions and negative polarity ions can be output alternately from the discharge electrode.

In accordance with the high voltage generation circuit according to the present invention, a high voltage generation circuit can be realized, which generates positive polarity and negative polarity high voltages by means of a simple configuration, and is capable of reducing switching noise. In addition, the consumption current can be reduced insofar as possible, and the amount of heat generated thereby can be suppressed.

The above and other objects, features, and advantages of the present invention will become more apparent from the following description when taken in conjunction with the accompanying drawings, in which preferred embodiments of the present invention are shown by way of illustrative example.

DESCRIPTION OF THE PREFERRED EMBODIMENTS

Preferred embodiments of a high voltage generation circuit according to the present invention will be presented and described in detail below with reference to the accompanying drawings.

Figure 1:
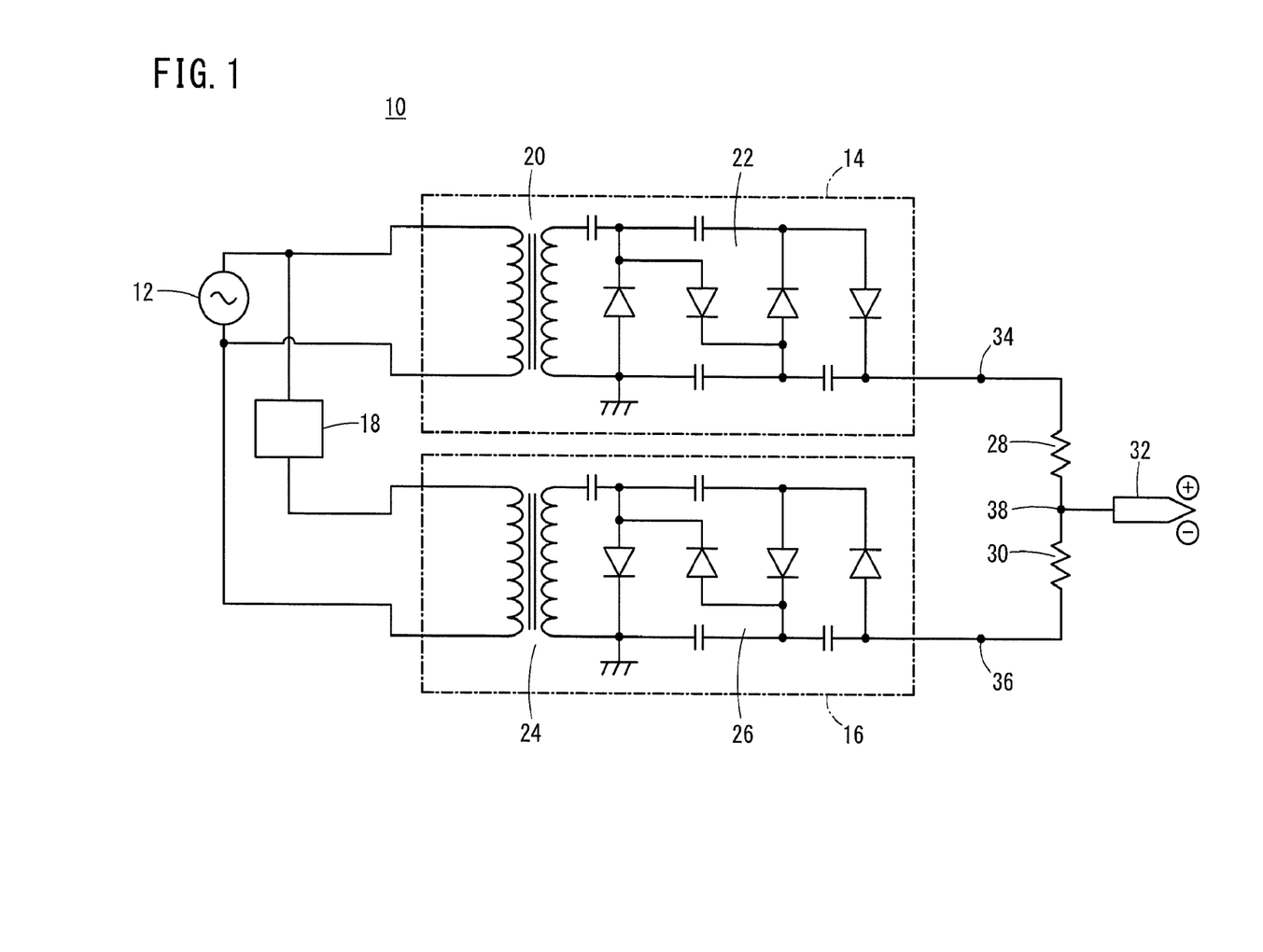
FIG. 1 is a circuit diagram showing a high voltage generation circuit according to a first embodiment of the present invention.

With reference to FIG. 1, a description will now be given concerning a high voltage generation circuit 10 according to a first embodiment. The high voltage generation circuit 10 is used in an ionizer that outputs positive polarity ions and negative polarity ions from a discharge electrode 32 (load). As shown in FIG. 1, the high voltage generation circuit 10 is equipped with an alternating-current power source (AC power source) 12, a positive polarity high voltage generating circuit 14, a negative polarity high voltage generating circuit 16, and a phase converter 18, etc.

The positive polarity high voltage generating circuit 14 is constituted from a transformer for positive polarity 20 (hereinafter also referred to as a positive polarity transformer 20) and a voltage doubler rectifier circuit for positive polarity 22 (hereinafter also referred to as a positive polarity voltage doubler rectifier circuit 22). A primary side of the positive polarity transformer 20 is connected to the AC power source 12, and a secondary side of the positive polarity transformer 20 is connected to the positive polarity voltage doubler rectifier circuit 22. The positive polarity voltage doubler rectifier circuit 22 is a known type of circuit referred to as a Cockcroft-Walton circuit, which is made up from a combination of a plurality of capacitors and the same number of diodes. The positive polarity voltage doubler rectifier circuit 22 of the present embodiment is equipped with four capacitors and four diodes, and a direct current of four times the voltage input thereto is obtained.

The negative polarity high voltage generating circuit 16 is constituted from a transformer for negative polarity 24 (hereinafter also referred to as a negative polarity transformer 24) and a voltage doubler rectifier circuit for negative polarity 26 (hereinafter also referred to as a negative polarity voltage doubler rectifier circuit 26). A primary side of the negative polarity transformer 24 is connected to a combination of the AC power source 12 and the phase converter 18, and the secondary side of the negative polarity transformer 24 is connected to the negative polarity voltage doubler rectifier circuit 26. The negative polarity voltage doubler rectifier circuit 26, in the same manner as the positive polarity voltage doubler rectifier circuit 22, is made up from a combination of a plurality of capacitors and the same number of diodes. The negative polarity voltage doubler rectifier circuit 26 of the present embodiment is equipped with four capacitors and four diodes.

The AC power source 12 is a single-phase AC power source that supplies an alternating-current voltage (AC voltage) having a predetermined voltage value and a predetermined frequency. The phase converter 18 serves to shift the phase of the AC voltage supplied from the AC power source 12 by 180 degrees and thereafter apply the AC voltage to the primary side of the negative polarity transformer 24, and is disposed between one terminal of the AC power source 12 and one terminal of the primary side of the negative polarity transformer 24. Consequently, the AC voltage supplied from the AC power source 12 is inverted in phase by the phase converter 18, and is applied to the primary side of the negative polarity transformer 24.

The ionizer is equipped with a discharge electrode 32 for alternately generating positive ions and negative ions. Two resistor elements (impedance elements) 28, 30 that limit the current value are connected in series between an output terminal 34 of the positive polarity high voltage generating circuit 14 and an output terminal 36 of the negative polarity high voltage generating circuit 16. The discharge electrode 32 is connected to a connection point 38 between the resistor element 28 and the resistor element 30. In accordance with this feature, a differential voltage between the output voltage of the positive polarity high voltage generating circuit 14 and the output voltage of the negative polarity high voltage generating circuit 16 is subjected to voltage dividing and then applied to the discharge electrode 32. According to the present embodiment, the resistance values of the two resistor elements 28 and 30 are the same.

The high voltage generation circuit 10 according to the first embodiment is basically configured as described above. Next, operations of the high voltage generation circuit 10 will be described below with reference to FIG. 2.

The AC voltage from the AC power source 12 is applied as is to the primary side of the positive polarity transformer 20, while the AC voltage is inverted in phase by the phase converter 18 and applied to the primary side of the negative polarity transformer 24. In the top and middle parts of FIG. 2, a voltage waveform applied to the primary side of the positive polarity transformer 20, and a voltage waveform applied to the primary side of the negative polarity transformer 24 are shown alongside each other.

Figure 2:
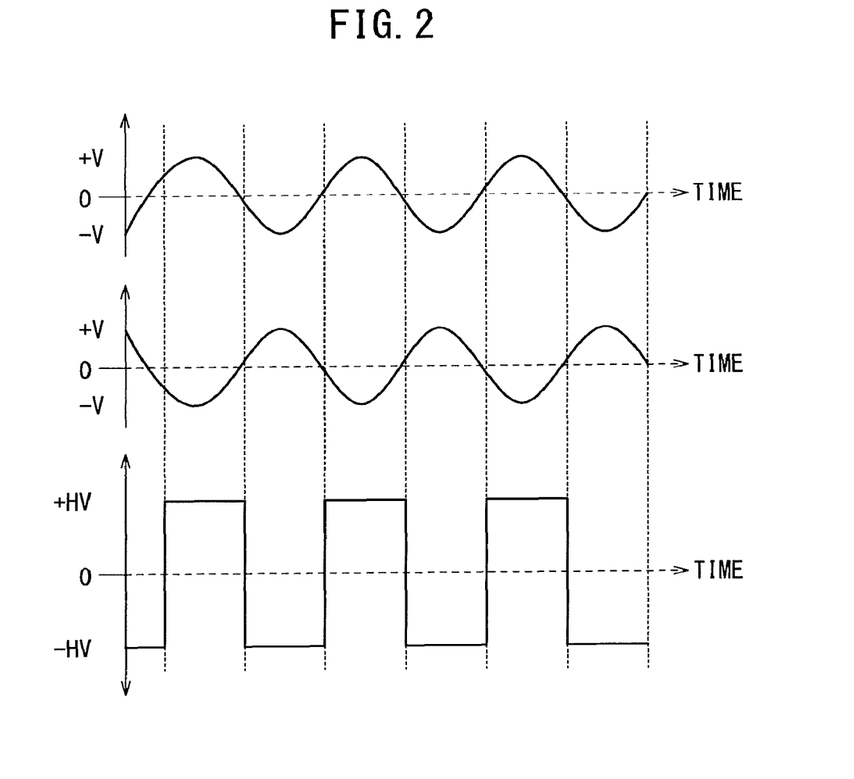
FIG. 2 is a time diagram showing voltage waveforms of voltages applied to a primary side of a transformer for positive polarity, a primary side of a transformer for negative polarity, and a discharge electrode, in relation to the high voltage generation circuit of FIG. 1.

The AC voltage applied to the primary side of the positive polarity transformer 20 is transformed at the secondary side thereof, and thereafter, is rectified into a positive polarity pulse high voltage by the positive polarity voltage doubler rectifier circuit 22. The AC voltage applied to the primary side of the negative polarity transformer 24 is transformed at the secondary side thereof, and thereafter, is rectified into a negative polarity pulse high voltage by the negative polarity voltage doubler rectifier circuit 26.

The phase of the AC voltage applied to the primary side of the negative polarity transformer 24 has an inverted relationship with respect to the phase of the AC voltage applied to the primary side of the positive polarity transformer 20, and therefore, the positive polarity pulse high voltage and the negative polarity pulse high voltage are exactly shifted in timing. More specifically, the positive polarity pulse high voltage and the negative polarity pulse high voltage are generated alternately in a continuous manner. The waveform of the pulse high voltage that is applied to the discharge electrode 32 is shown in the lower part of FIG. 2.

When the positive polarity pulse high voltage is generated, positive polarity ions are output from the discharge electrode 32, whereas when the negative polarity pulse high voltage is generated, negative polarity ions are output from the discharge electrode 32. The positive polarity ions and the negative polarity ions are sprayed onto a target object to thereby neutralize the target object.

Figure 3:
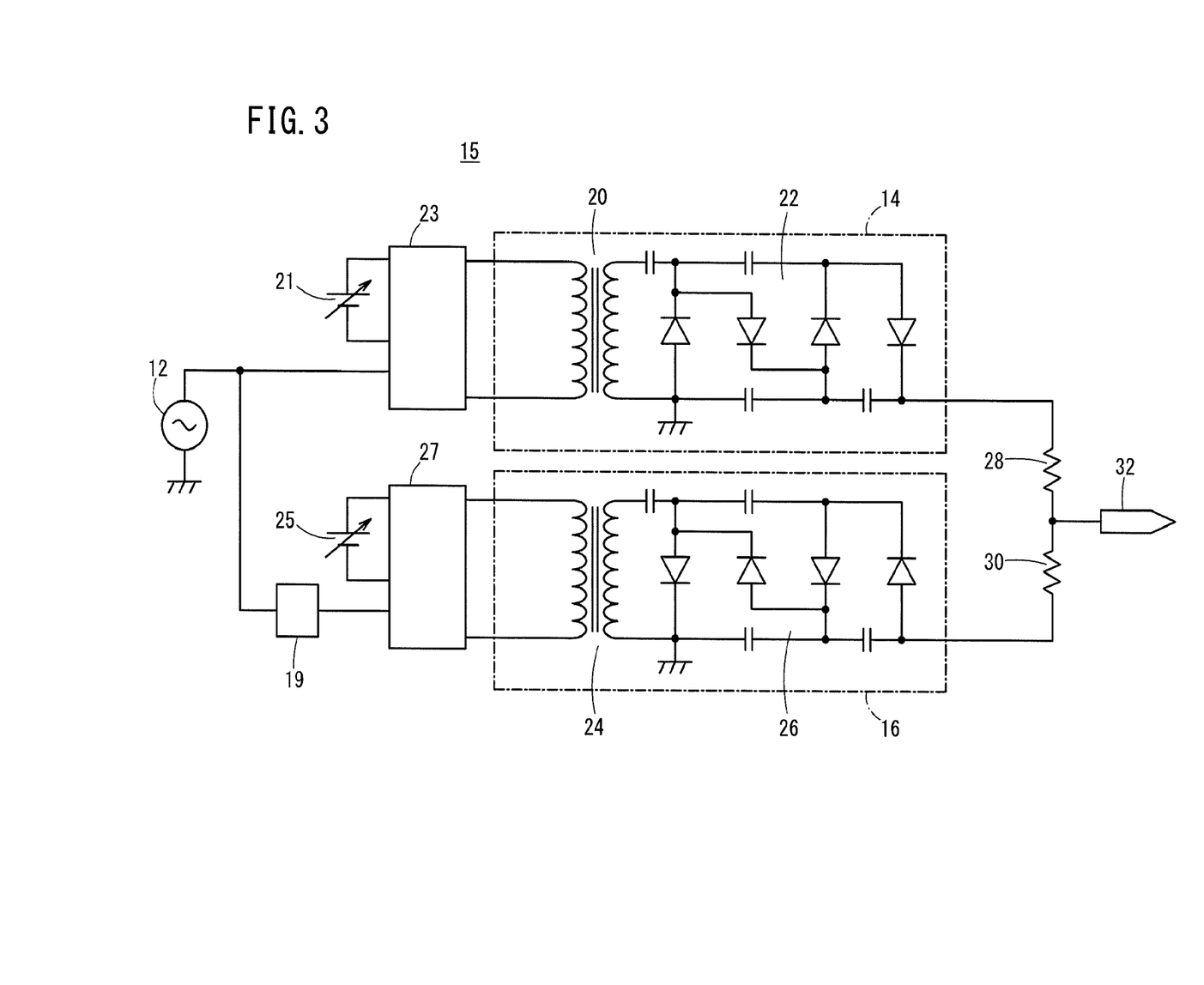
FIG. 3 is a circuit diagram showing a high voltage generation circuit according to a second embodiment of the present invention.

Next, with reference to FIG. 3, a description will be given concerning a high voltage generation circuit 15 according to a second embodiment. Constituent elements that are the same as those in the high voltage generation circuit 10 according to the aforementioned first embodiment are denoted by the same reference characters, and detailed description of such features is omitted.

According to the high voltage generation circuit 15, a transformer driving circuit for positive polarity 23 (hereinafter referred to as a positive polarity transformer driving circuit 23), which is equipped with a variable voltage DC (direct-current) power source 21, is disposed between the AC power source 12 and the positive polarity transformer 20. The AC voltage supplied from the AC power source 12 is applied to the primary side of the positive polarity transformer 20 after the voltage level thereof has been adjusted by the positive polarity transformer driving circuit 23.

Further, a transformer driving circuit for negative polarity 27 (hereinafter also referred to as a negative polarity transformer driving circuit 27), which is equipped with a phase converter 19 and a variable voltage DC power source 25, is disposed between the AC power source 12 and the negative polarity transformer 24. The AC voltage supplied from the AC power source 12 is shifted 180 degrees (the phase thereof is inverted) by the phase converter 19, and furthermore, the voltage level thereof is adjusted by the negative polarity transformer driving circuit 27. Thereafter, the AC voltage is applied to the primary side of the negative polarity transformer 24.

In accordance with the high voltage generation circuit 15 according to the second embodiment, the voltage level of the AC voltage that is applied to the primary side of the positive polarity transformer 20, and the voltage level of the AC voltage that is applied to the primary side of the negative polarity transformer 24 can be individually controlled. Consequently, the output voltage of the positive polarity high voltage generating circuit 14 and the output voltage of the negative polarity high voltage generating circuit 16 can be individually controlled.

Figure 4:
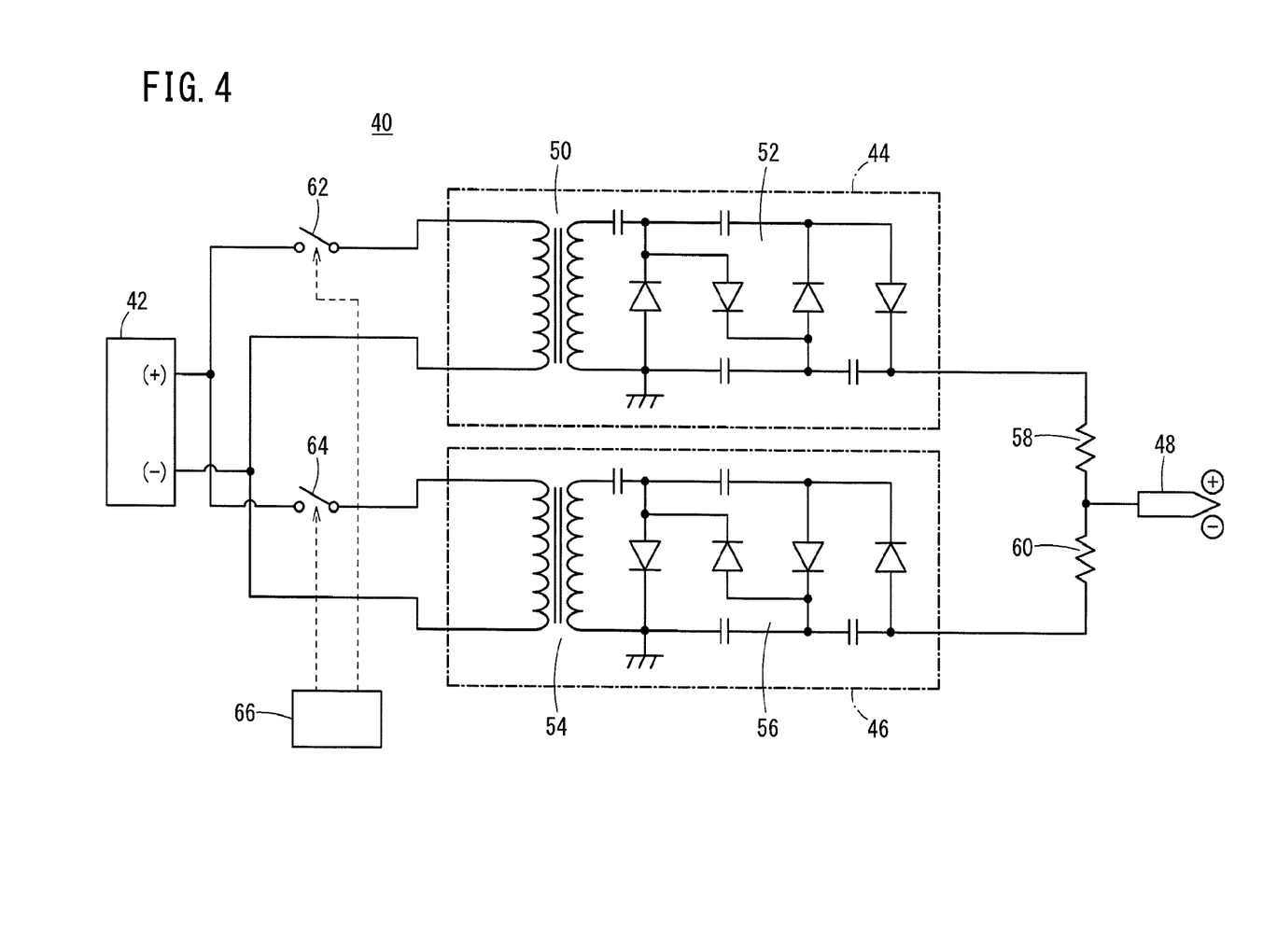
FIG. 4 is a circuit diagram showing a high voltage generation circuit according to a comparative example.

FIG. 4 shows a high voltage generation circuit 40 according to a comparative example. The high voltage generation circuit 40 is equipped with a DC power source 42. A first electronic switch 62 is disposed between the DC power source 42 and a positive polarity high voltage generating circuit 44, and a second electronic switch 64 is disposed between the DC power source 42 and a negative polarity high voltage generating circuit 46.

The positive polarity high voltage generating circuit 44, in the same manner as each of the embodiments of the present invention, is constituted from a positive polarity transformer 50 and a positive polarity voltage doubler rectifier circuit 52. The negative polarity high voltage generating circuit 46, in the same manner as each of the embodiments of the present invention, is constituted from a negative polarity transformer 54 and a negative polarity voltage doubler rectifier circuit 56. Further, the comparative example is similar to each of the embodiments of the present invention, in that two resistor elements 58, 60 are connected in series between the output terminal of the positive polarity high voltage generating circuit 44 and the output terminal of the negative polarity high voltage generating circuit 46, and a discharge electrode 48 is connected to a connection point between the resistor element 58 and the resistor element 60.

Figure 5:
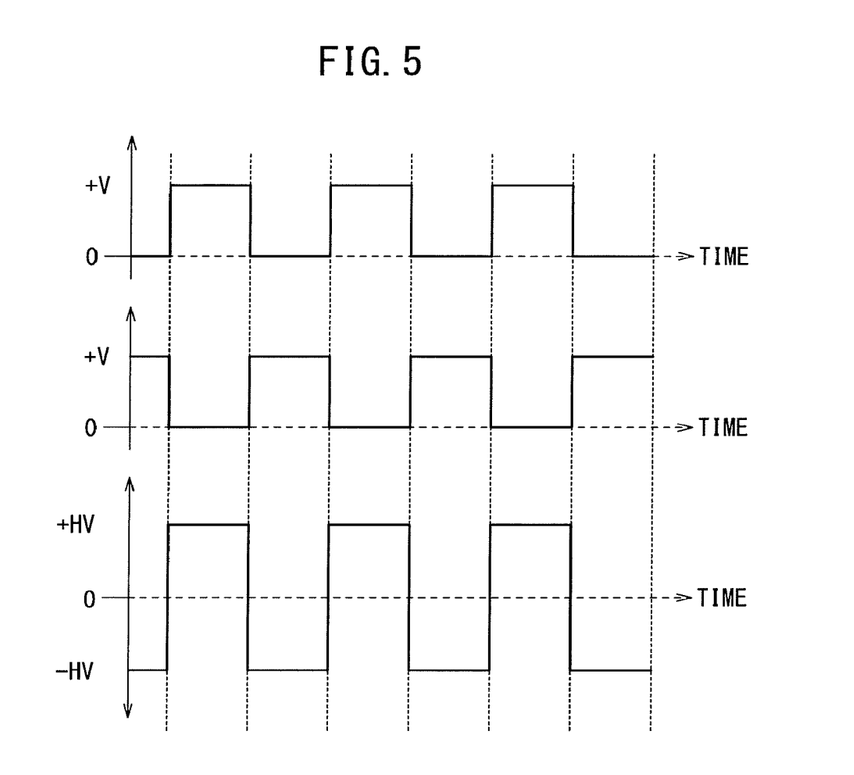
FIG. 5 is a time diagram showing voltage waveforms of voltages applied to a primary side of a transformer for positive polarity, a primary side of a transformer for negative polarity, and a discharge electrode, in relation to the high voltage generation circuit of FIG. 4.

The first electronic switch 62 and the second electronic switch 64 are alternately turned on and off in a periodic manner. As a result, a pulse voltage is periodically and alternately applied to the primary side of the positive polarity transformer 50, and to the primary side of the negative polarity transformer 54. In the top and middle parts of FIG. 5, a voltage waveform applied to the primary side of the positive polarity transformer 50, and a voltage waveform applied to the primary side of the negative polarity transformer 54 are shown alongside each other. The waveform of the pulse high voltage that is applied to the discharge electrode 48 is shown in the lower part of FIG. 5.

Below, with reference to FIGS. 6A, 6B, and 7, in comparison between the high voltage generation circuit 10 according to the first embodiment and the high voltage generation circuit 40 of the comparative example, differences of the consumption current and the amount of generated heat will be described. The sizes and waveforms of the pulsed high voltages applied to the discharge electrode are basically the same in both the first embodiment and the comparative example. Further, in the following description, for purposes of convenience, only the first embodiment is described by way of comparison with the comparative example. However, a case in which the second embodiment is compared with the comparative example is basically the same.

Figure 6A:
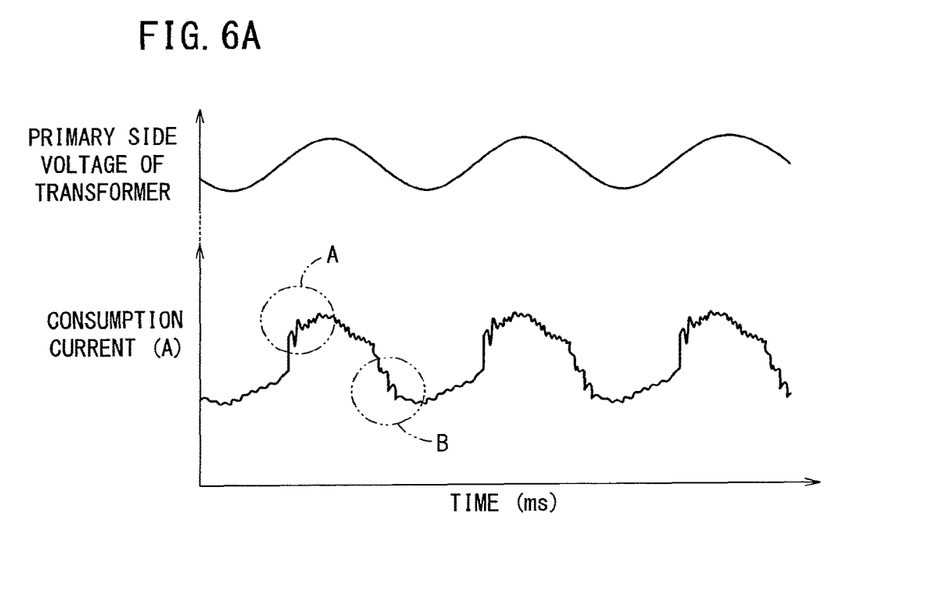
FIG. 6A is a time diagram showing the voltage applied to a primary side of the transformer for positive polarity, and a consumption current at the primary side of the transformer for positive polarity, in relation to the high voltage generation circuit of FIG. 1.
Figure 6B:
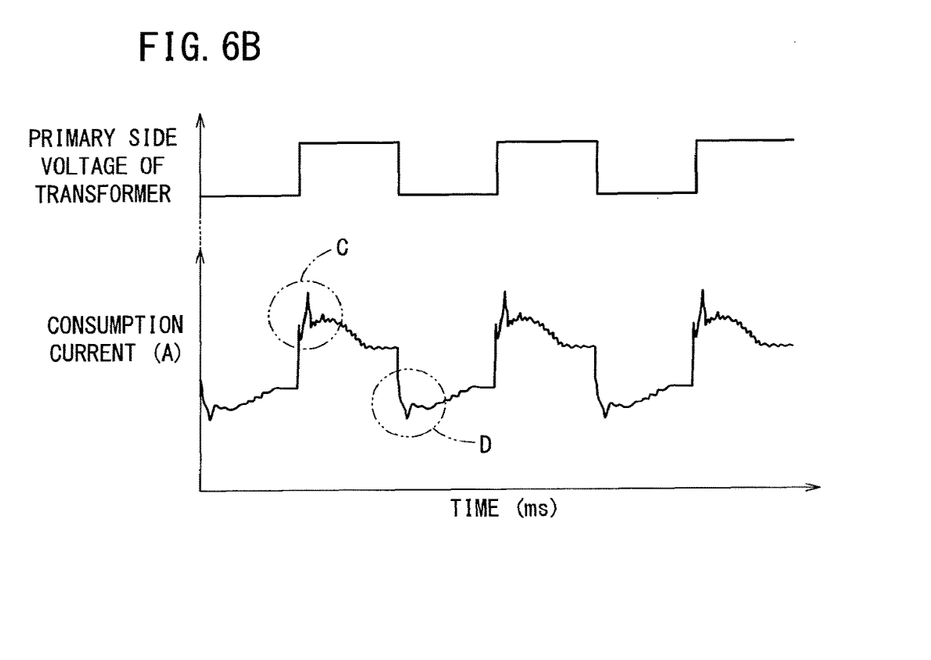
FIG. 6B is a time diagram showing the voltage applied to a primary side of the transformer for positive polarity, and a consumption current at the primary side of the transformer for positive polarity, in relation to the high voltage generation circuit of FIG. 4.

In FIG. 6A, concerning the first embodiment, the voltage applied to the primary side of the positive polarity transformer and the consumption current at the primary side of the positive polarity transformer are aligned and arranged vertically. In FIG. 6B, concerning the comparative example, the voltage applied to the primary side of the positive polarity transformer and the consumption current at the primary side of the positive polarity transformer are aligned and arranged vertically. In the figures, the units and scale on the vertical axis and the horizontal axis are omitted, however, in both the first embodiment and the comparative example, the peak-to-peak value of the voltage applied to the primary side of the transformer is 10 V.

According to the comparative example, as shown in the region of reference character C, a portion of the waveform exists in which a peak is exhibited instantaneously when the direction of the consumption current is changed to one direction. Further, as shown in the region of the reference character D, a portion of the waveform exists in which a peak is exhibited instantaneously when the direction of the consumption current is changed to the other direction. In contrast thereto, according to the first embodiment, as can be seen from the figure, such waveform portions are not present (refer to the regions of reference characters A and B), and noise is thus suppressed. In the comparative example, the maximum value of the consumption current in the one direction, i.e., the maximum value of the consumption current in the region of reference character C, is 300 mA greater than the maximum value of the consumption current of the first embodiment in the one direction, i.e., the maximum value of the consumption current in the region of reference character A according to the first embodiment.

Figure 7:
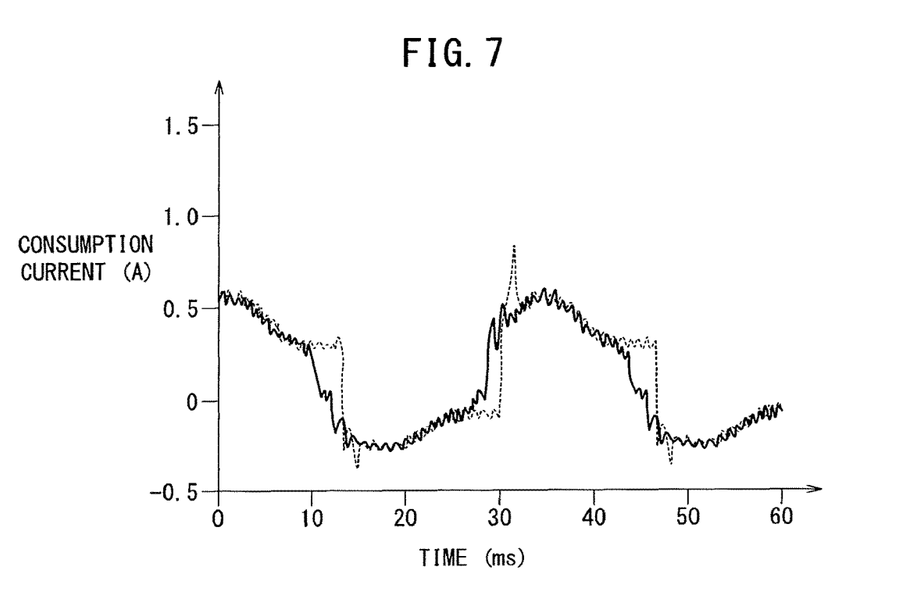
FIG. 7 is a time diagram in which the consumption current of FIG. 6A and the consumption current of FIG. 6B are overlaid on one another and compared.

In FIG. 7, the consumption currents of the first embodiment and the comparative example are overlaid on one another and compared. The solid line represents the consumption current according to the first embodiment, whereas the dotted line represents the consumption current according to the comparative example. In the first embodiment, in which the voltage applied to the primary side of the transformer is continuously varied sinusoidally, the period of time during which the consumption current is small occurs more frequently than in the comparative example, in which the voltage applied to the primary side of the transformer is of a pulsed form. Thus, it is understood that the value obtained by integrating the consumption current over time, i.e., the area formed between the consumption current curve and the time axis, is smaller in the first embodiment, and the amount of heat generated by the transformer is accordingly smaller in the first embodiment. Upon measuring the temperature in the vicinity of the transformer, the temperature was 55° C. according to the comparative example, whereas the temperature was 52° C. according to the first embodiment.

In accordance with the high voltage generation circuits 10, 15 according to the embodiments of the present invention, a high voltage generation circuit can be realized, which generates positive polarity and negative polarity high voltages by means of a simple configuration, and is capable of reducing switching noise. In addition, the consumption current can be reduced insofar as possible, and the amount of heat generated thereby can be suppressed.

Further, positive polarity ions and negative polarity ions can be output alternately from the discharge electrode 32 of the ionizer.

Furthermore, in accordance with the high voltage generation circuit 15 according to the second embodiment, the output voltage of the positive polarity high voltage generating circuit 14 and the output voltage of the negative polarity high voltage generating circuit 16 can be individually controlled.

The AC voltage that is supplied to the positive polarity transformer 20 and the negative polarity transformer 24 from the AC power source 12 is not limited to a voltage having a predetermined voltage value and a predetermined frequency at all times, but may be a voltage whose voltage value and frequency are variable.

The high voltage generation circuit according to the present invention is not limited to the embodiments described above, and it goes without saying that various modified or additional configurations can be adopted therein without deviating from the scope of the present invention as set forth in the appended claims.

What is claimed is:

1. A high voltage generation circuit for alternately applying a positive pulse high voltage and a negative pulse high voltage to a load, comprising:
    an AC power source;
    a positive polarity high voltage generating circuit;
    a negative polarity high voltage generating circuit which is different from the positive polarity high voltage generating circuit; and
    a circuit output which outputs to the load a combined voltage which includes an output of the positive polarity high voltage generating circuit and an output of the negative polarity high voltage generating driving circuit,
    wherein a phase converter configured to convert a phase of an AC voltage supplied from the AC power source is disposed between the AC power source and the positive polarity high voltage generating circuit, or between the AC power source and the negative polarity high voltage generating circuit.

2. The high voltage generation circuit according to claim 1, wherein the phase converter inverts the phase of the AC voltage supplied from the AC power source.

3. The high voltage generation circuit according to claim 1, wherein each of the positive polarity high voltage generating circuit and the negative polarity high voltage generating circuit comprises a transformer and a voltage doubler rectifier circuit.

4. The high voltage generation circuit according to claim 3, wherein transformer driving circuits configured to adjust voltage level are disposed respectively between the AC power source and the positive polarity high voltage generating circuit, and between the AC power source and the negative polarity high voltage generating circuit.

5. The high voltage generation circuit according to claim 1, further comprising:
    a first impedance element connected between the positive polarity high voltage generating circuit and the circuit output, and a second impedance element connected between the negative polarity high voltage generating circuit and the circuit output.

6. The high voltage generation circuit according to claim 1, wherein the load is a discharge electrode of an ionizer.

* * * * *